US012745646B2

(12) United States Patent
Lee et al.

(10) Patent No.: US 12,745,646 B2
(45) Date of Patent: Sep. 22, 2026

(54) ELECTRONIC DEVICES AND METHODS OF MANUFACTURING ELECTRONIC DEVICES

(71) Applicant: Amkor Technology Singapore Holding Pte. Ltd., Singapore (SG)

(72) Inventors: Tae Yong Lee, Gyeonggi-do (KR); Min Won Park, Incheon (KR); Jeong Hyun Yang, Seoul (KR); Bo Yoon Yoo, Incheon (KR)

(73) Assignee: Amkor Technology Singapore Holding Pte. Ltd., Singapore (SG)

( * ) Notice: Subject to any disclaimer, the term of this patent is extended or adjusted under 35 U.S.C. 154(b) by 355 days.

(21) Appl. No.: 18/213,105

(22) Filed: Jun. 22, 2023

(65) Prior Publication Data

US 2024/0429183 A1 Dec. 26, 2024

(51) Int. Cl.
*H01L 23/66* (2006.01)
*H01L 21/56* (2006.01)
(Continued)

(52) U.S. Cl.
CPC ........... *H10W 44/20* (2026.01); *H10W 20/42* (2026.01); *H10W 42/20* (2026.01);
(Continued)

(58) Field of Classification Search
CPC . H01L 23/66; H01L 23/3128; H01L 23/5226; H01L 23/552; H01L 21/568;
(Continued)

(56) References Cited

U.S. PATENT DOCUMENTS

| | | | |
|---|---|---|---|
| 6,639,299 B2 | 10/2003 | Aoki | |
| 8,766,858 B2 | 7/2014 | Li et al. | |

(Continued)

FOREIGN PATENT DOCUMENTS

| | | |
|---|---|---|
| CN | 1273701 A | 11/2000 |
| CN | 110768006 A | 2/2020 |
| CN | 111063988 A | 4/2020 |

OTHER PUBLICATIONS

Amkor Technology, System in Package, Technology Solutions, Feb. 2022, Amkor Technology Incorporated, Tempe, Arizona, USA.

*Primary Examiner* — Tu-Tu V Ho
(74) *Attorney, Agent, or Firm* — Spectrum IP Law Group LLC

(57) ABSTRACT

In one example, an electronic device comprises a first substrate comprising a first dielectric structure and a first conductive structure, a first interconnect structure over an inward side of the first substrate and coupled with the first conductive structure, a first encapsulant over the inward side of the first substrate and contacting a lateral side of the first interconnect structure, a second substrate over the first encapsulant and comprising a second dielectric structure and a second conductive structure, wherein the second conductive structure is coupled with the first interconnect structure, and a first electronic component coupled with an outward side of the first substrate. The first electronic component is coupled with the second conductive structure via the first interconnect structure and the first conductive structure. Other examples and related methods are also disclosed herein.

17 Claims, 9 Drawing Sheets

(51) Int. Cl.
*H10W 20/42* (2026.01)
*H10W 42/20* (2026.01)
*H10W 44/20* (2026.01)
*H10W 74/01* (2026.01)
*H10W 74/10* (2026.01)
*H10W 90/00* (2026.01)

(52) U.S. Cl.
CPC ........ *H10W 74/019* (2026.01); *H10W 74/117* (2026.01); *H10W 44/248* (2026.01); *H10W 90/724* (2026.01)

(58) Field of Classification Search
CPC ............. H01L 24/16; H01L 2223/6677; H01L 2224/16225; H01L 2924/19041; H01L 2924/3025
USPC .......................................................... 257/773
See application file for complete search history.

(56) References Cited

U.S. PATENT DOCUMENTS 9,437,535 B2 9/2016 Nakamura et al.
10,074,604 B1 9/2018 Hou et al.
10,074,615 B1 9/2018 Tseng et al.
10,134,685 B1 11/2018 Chen et al.
10,157,834 B1 12/2018 Tang et al.
10,157,850 B1 12/2018 Wu et al.
10,157,862 B1 12/2018 Chen et al.
10,157,870 B1 12/2018 Wu et al.
10,157,871 B1 12/2018 Yu et al.
10,319,688 B2 6/2019 Wolter et al.
10,431,892 B2 10/2019 Garcia et al.
10,566,299 B2 2/2020 Chiang et al.
10,573,608 B2 2/2020 Dogiamis et al.
2003/0142018 A1 7/2003 Lange
2007/0231962 A1 10/2007 Fujii
2009/0168367 A1 7/2009 Fujii
2013/0009320 A1 1/2013 Yoo et al.
2013/0168848 A1 7/2013 Lin et al.
2014/0035097 A1 2/2014 Lin et al.
2014/0151860 A1 6/2014 Nakamura et al.
2014/0327155 A1 11/2014 Kang et al.
2015/0145108 A1 5/2015 Yap et al.
2015/0207197 A1 7/2015 Fujita et al.
2015/0262902 A1 9/2015 Shen et al.
2015/0280327 A1 10/2015 Spella
2015/0325925 A1 11/2015 Kamgaing et al.
2016/0172761 A1 6/2016 Garcia et al.
2016/0190053 A1 6/2016 Machida
2016/0218072 A1 7/2016 Liao et al.
2016/0329299 A1 11/2016 Lin et al.
2017/0125355 A1 5/2017 Su et al.
2017/0345761 A1* 11/2017 Yu ....................... H01L 21/4853
2018/0061726 A1 3/2018 Anderson et al.
2018/0082954 A1 3/2018 Lin et al.
2018/0096942 A1 4/2018 Chiu et al.
2018/0286776 A1 10/2018 Tai et al.
2018/0337148 A1 11/2018 Baek et al.
2018/0366439 A1 12/2018 Lin et al.
2019/0020114 A1 1/2019 Paulotto et al.
2019/0067219 A1 2/2019 Lasiter et al.
2019/0116670 A1 4/2019 Anderson et al.
2019/0157762 A1 5/2019 Shibata et al.
2019/0221937 A1 7/2019 Onaka et al.
2019/0288382 A1 9/2019 Kamgaing et al.
2019/0355680 A1 11/2019 Chuang et al.
2020/0006846 A1 1/2020 Lasiter et al.
2020/0035625 A1 1/2020 Wang et al.
2020/0075503 A1 3/2020 Chuang et al.
2020/0076052 A1 3/2020 Fay
2020/0091095 A1 3/2020 Jung et al.
2020/0161766 A1 5/2020 Liu et al.
2020/0212536 A1 7/2020 Gupta et al.
2020/0259239 A1 8/2020 Moallem et al.
2020/0313279 A1 10/2020 Kim et al.
2020/0335869 A1 10/2020 Jia
2021/0013585 A1 1/2021 Ho et al.
2021/0050651 A1 2/2021 Jung et al.
2021/0234256 A1 7/2021 Landesberger et al.
2021/0273315 A1 9/2021 Cheng
2021/0335734 A1 10/2021 You et al.
2021/0376490 A1 12/2021 Kim et al.
2022/0068739 A1 3/2022 Son et al.
2022/0069453 A1 3/2022 Yun et al.
2022/0085493 A1 3/2022 Jia
2022/0131262 A1 4/2022 Chiang et al.
2022/0166149 A1 5/2022 So et al.
2022/0255238 A1 8/2022 Yu
2022/0285844 A1 9/2022 Gupta et al.
2022/0344230 A1 10/2022 Chang
2022/0352623 A1 11/2022 Wang et al.
2022/0359975 A1 11/2022 Lai et al.
2022/0368003 A1 11/2022 Chiang et al.
2023/0028526 A1 1/2023 Kim et al.
2023/0088170 A1* 3/2023 Brun ....................... H01L 25/50 257/782
2023/0112892 A1 4/2023 Choi et al.
2023/0197679 A1* 6/2023 Ecton ...................... H01L 24/73 257/668
2024/0096858 A1 3/2024 Lee et al.
2024/0258689 A1 8/2024 Tian et al.

* cited by examiner 141
140
460
150
410
170
462a
420a
421a
420b
421b
462b
420
329
430
421
412
412b
411
412c
412a
462
461
180
470
391
390

ELECTRONIC DEVICES AND METHODS OF MANUFACTURING ELECTRONIC DEVICES

TECHNICAL FIELD

The present disclosure relates, in general, to electronic devices, and more particularly, to electronic devices and methods for manufacturing electronic devices.

BACKGROUND

Prior electronic packages and methods for forming electronic packages are inadequate, for example resulting in excess cost, decreased reliability, relatively low performance, or package sizes that are too large. Further limitations and disadvantages of conventional and traditional approaches will become apparent to one of skill in the art, through comparison of such approaches with the present disclosure and reference to the drawings.

Figures 1, 2A:
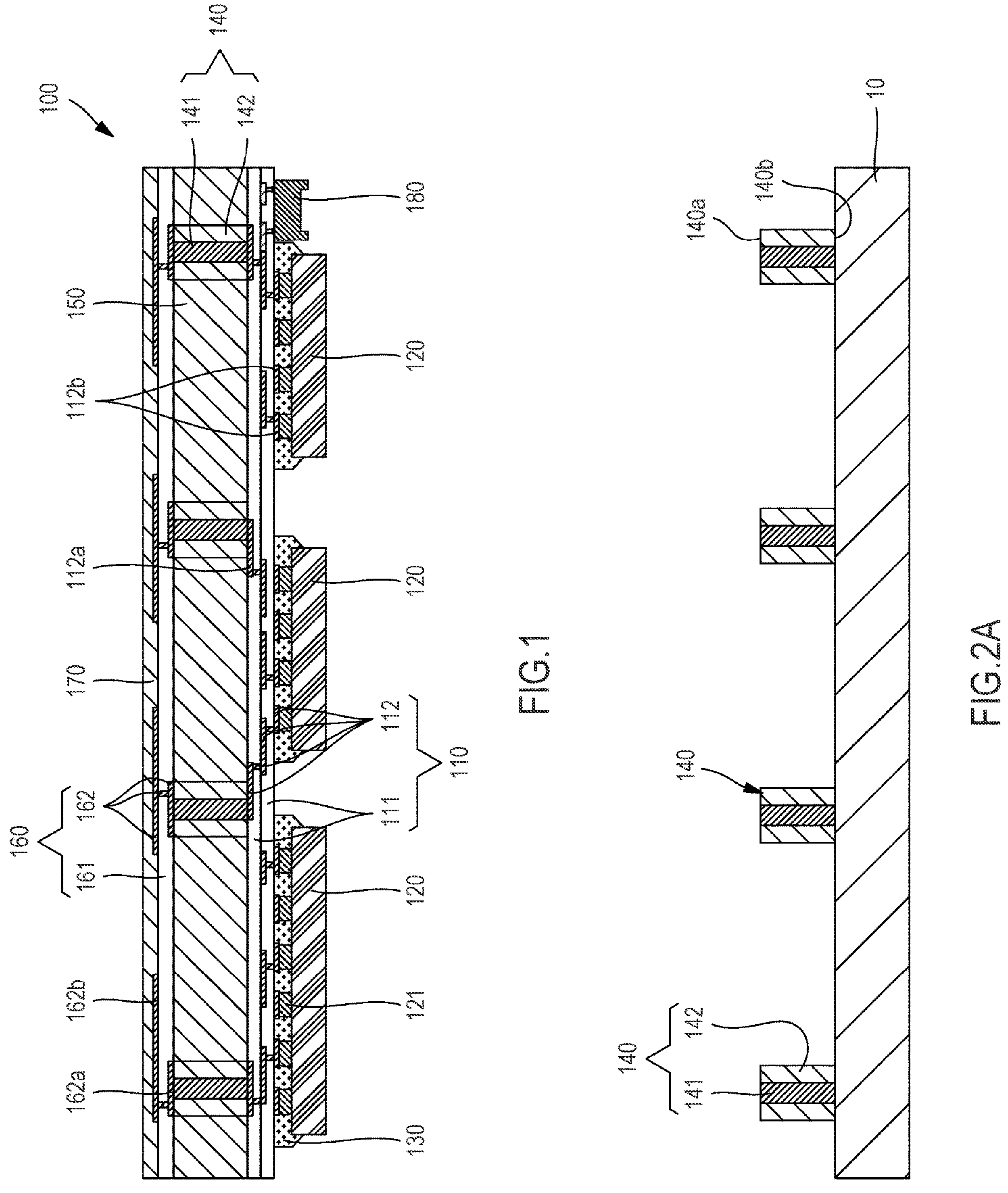
FIG. 1 shows a cross-sectional view of an example electronic device.
FIGS. 2A to 2F show cross-sectional views of an example method for manufacturing an example electronic device.

The following discussion provides various examples of electronic devices and methods of manufacturing electronic devices. Such examples are non-limiting, and the scope of the appended claims should not be limited to the particular examples disclosed. In the following discussion, the terms "example" and "e.g.," are non-limiting.

The figures illustrate the general manner of construction, and descriptions and details of well-known features and techniques may be omitted to avoid unnecessarily obscuring the present disclosure. In addition, elements in the drawing figures are not necessarily drawn to scale. For example, the dimensions of some of the elements in the figures may be exaggerated relative to other elements to help improve understanding of the examples discussed in the present disclosure. The same reference numerals in different figures can denote the same elements.

The term "or" means any one or more of the items in the list joined by "or". As an example, "x or y" means any element of the three-element set {(x), (y), (x, y)}. As another example, "x, y, or z" means any element of the seven-element set {(x), (y), (z), (x, y), (x, z), (y, z), (x, y, z)}.

The terms "comprises," "comprising," "includes," and "including," are "open ended" terms and specify the presence of stated features, but do not preclude the presence or addition of one or more other features. The terms "first," "second," etc. may be used herein to describe various elements, and these elements should not be limited by these terms. These terms are only used to distinguish one element from another. Thus, for example, a first element discussed in this disclosure could be termed a second element without departing from the teachings of the present disclosure.

Unless specified otherwise, the term "coupled" may be used to describe two elements directly contacting each other or describe two elements indirectly coupled by one or more other elements. For example, if element A is coupled to element B, then element A can be directly contacting element B or indirectly coupled to element B by an intervening element C. Similarly, the terms "over" or "on" may be used to describe two elements directly contacting each other or describe two elements indirectly coupled by one or more other elements.

DESCRIPTION

In one example, an electronic device comprises a first substrate comprising a first dielectric structure and a first conductive structure, a first interconnect structure over an inward side of the first substrate and coupled with the first conductive structure, a first encapsulant over the inward side of the first substrate and contacting a lateral side of the first interconnect structure, a second substrate over the first encapsulant and comprising a second dielectric structure and a second conductive structure, wherein the second conductive structure is coupled with the first interconnect structure, and a first electronic component coupled with an outward side of the first substrate. The first electronic component is coupled with the second conductive structure via the first interconnect structure and the first conductive structure.

In another example, an electronic device comprises a first substrate comprising a first dielectric structure and a first conductive structure, a first interconnect structure over a top side the first substrate and coupled with the first conductive structure, a first encapsulant over the first substrate and contacting a lateral side of the first interconnect structure, a second substrate over the first encapsulant and comprising a second dielectric structure and a second conductive structure, wherein the second conductive structure is coupled with the first interconnect structure, a first electronic component over a top side of the second substrate and coupled with the second conductive structure, a second electronic component coupled with the second conductive structure, and a second encapsulant over the top side of the second substrate and contacting a lateral side of the first electronic component.

In a further example, a method to manufacture an electronic device comprises providing a first interconnect structure, providing a first encapsulant contacting a lateral side of the first interconnect structure, providing a first substrate coupled with a first side of the first encapsulant, wherein the first substrate comprises a first dielectric structure and a first conductive structure, and wherein the first conductive structure is coupled with the first interconnect structure, providing a second substrate coupled with a second side of the first encapsulant, wherein the second substrate comprises a second dielectric structure and a second conductive structure, and wherein the second conductive structure is coupled with the first interconnect structure, and providing a first electronic component coupled with the first substrate. The first electronic component is coupled with the second conductive structure via the first interconnect structure and the first conductive structure.

Other examples are included in the present disclosure. Such examples may be found in the figures, in the claims, or in the description of the present disclosure.

FIG. 1 shows a cross-sectional view of an example electronic device 100. In the example shown in FIG. 1, electronic device 100 can comprise substrate 110 and substrate 160, electronic components 120, underfills 130, interconnect structure 140, and encapsulant 150 and encapsulant 170.

Substrate 110 can comprise dielectric structure 111 and conductive structure 112. Conductive structure 112 can comprise inward terminals 112*a* and outward terminals 112*b*. Substrate 160 can comprise dielectric structure 161 and conductive structure 162. Conductive structure 162 can comprise inward terminal 162*a* and outward terminal 162*b*. In some examples, electronic device 100 can include port or connector 180 coupled with conductive structure 111 of substrate 110. Connector 180 can be used to couple electronic device 100 to another electronic device, for example via an interconnect, cable, or printed circuit board (PCB) which can comprise a flexible PCB in some examples. In some examples, connector 180 can be omitted.

Electronic component 120 can comprise component interconnect 121. Interconnect structure 140 can comprise metal interconnect 141 and encapsulant 142. Interconnect structure 140 can be over an inward side of substrate 110 and can be coupled with conductive structure 112. Encapsulants 150 and 170 can comprise encapsulant materials. In some examples, encapsulant 142 can be referred to as interconnect encapsulant 142, and metal interconnect 141 can be bounded by interconnect encapsulant 142. Encapsulant 150 can be over the inward side of substrate 110 and can contact or cover a lateral side of interconnect structure 140. Substrate 160 can be over encapsulant 150. Conductive structure 162 can be coupled with interconnect structure 140. Electronic component 120 can be coupled with an outward side of substrate 110. Electronic component 120 can be coupled with conductive structure 162 via interconnect structure 140 and conductive structure 112. Encapsulant 170 can be over an outward side of substrate 160 and can cover or protect conductive structure 162.

FIGS. 2A to 2F show cross-sectional views of an example method for manufacturing an example electronic device 100. FIG. 2A shows electronic device 100 at an early stage of manufacture. In the example shown in FIG. 2A, interconnect structure 140 can be provided on one side of carrier 10. In some examples, interconnect structure 140 can comprise or be referred to as a copper column cube (CCC), a copper (Cu) post, a Cu pillar, a copper core solder ball (CCB), a solder ball, or a wire. For example, interconnect structure 140 can be applied by electrolytic plating, electroless plating, sputtering, physical vapor deposition (PVD), chemical vapor deposition (CVD), metal organic chemical vapor deposition (MOCVD), atomic layer deposition (ALD), low pressure chemical vapor deposition (LPCVD) plasma enhanced chemical vapor deposition (PECVD), or ball drop. In some examples, interconnect structure 140 can be made of copper, gold, silver, palladium, or nickel.

When interconnect structure 140 is a CCC, interconnect structure 140 can comprise one or more metal interconnects 141 and encapsulant 142 covering sidewalls of such one or more metal interconnects 141. In some examples, the CCC can comprise one or more rows of metal interconnects 141. Metal interconnect 141 can pass between one external side and another external side of encapsulant 142. One side of metal interconnect 141 and one side of encapsulant 142 can be coplanar, and another side of metal interconnect 141 and another of encapsulant 142 can be coplanar. In some examples, encapsulant 142 can comprise an epoxy mold compound, resin, filler-reinforced polymer, B-stage pressed film, or gel.

In some examples, interconnect structure 140 can be picked up by pick-and-place equipment and seated and glued to one side of carrier 10. Side 140*b* of interconnect structure 140 can be bonded to one side of carrier 10. Interconnect structure 140 can be attached on carrier 10 to have rows or columns. By seating and bonding CCC, the process efficiency can be enhanced, for example compared to a case of providing interconnect structure 140 by plating or deposition. The height of interconnect structure 140 can range from approximately 1 micrometers (μm) to approximately 300 μm.

Carrier 10 can be a substantially planar plate. In some examples, carrier 10 can comprise or be referred to as a plate, a board, a wafer, a panel, or a strip. For example, carrier 10 can be made of steel, stainless steel, aluminum, copper, ceramic, glass, or a wafer. In some examples, the thickness of carrier 10 can range from approximately 300 μm to approximately 2000 μm, and the width of carrier 10 can range from approximately 100 millimeters (mm) to approximately 300 mm. Carrier 10 serves to integrally handle components in a process of providing substrate 110, interconnect structure 140, and encapsulant 150.

Carrier 10 can comprise a temporary bond layer provided on one side. Interconnect structure 140 can be provided on one side of the temporary bond layer of carrier 10 to be bonded and fixed. The temporary bond layer can be formed on one side of carrier 10 by a coating method such as spin coating, doctor blade coating, casting, painting, spray coating, slot die coating, curtain coating, slide coating, or knife over edge coating, printing methods such as screen printing, pad printing, gravure printing, flexography printing, or offset printing, an inkjet printing method, an intermediate technology between coating and printing, or by direct attachment of an adhesive film or adhesive tape. In some examples, the temporary bond layer can be referred to as a temporary adhesive film, a temporary adhesive tape or a temporary adhesive coating. For example, the temporary bond layer can be a heat release tape or film or an optical release tape or film, and the adhesive strength can be weakened or removed by heat or light. In some examples, the temporary bond layer can have adhesive force weakened or removed by physical or chemical external force. The temporary bond layer can allow carrier 10 to be separated from interconnect structure 140 and encapsulant 150 before substrate 160 is provided.

Figures 2B, 2C:
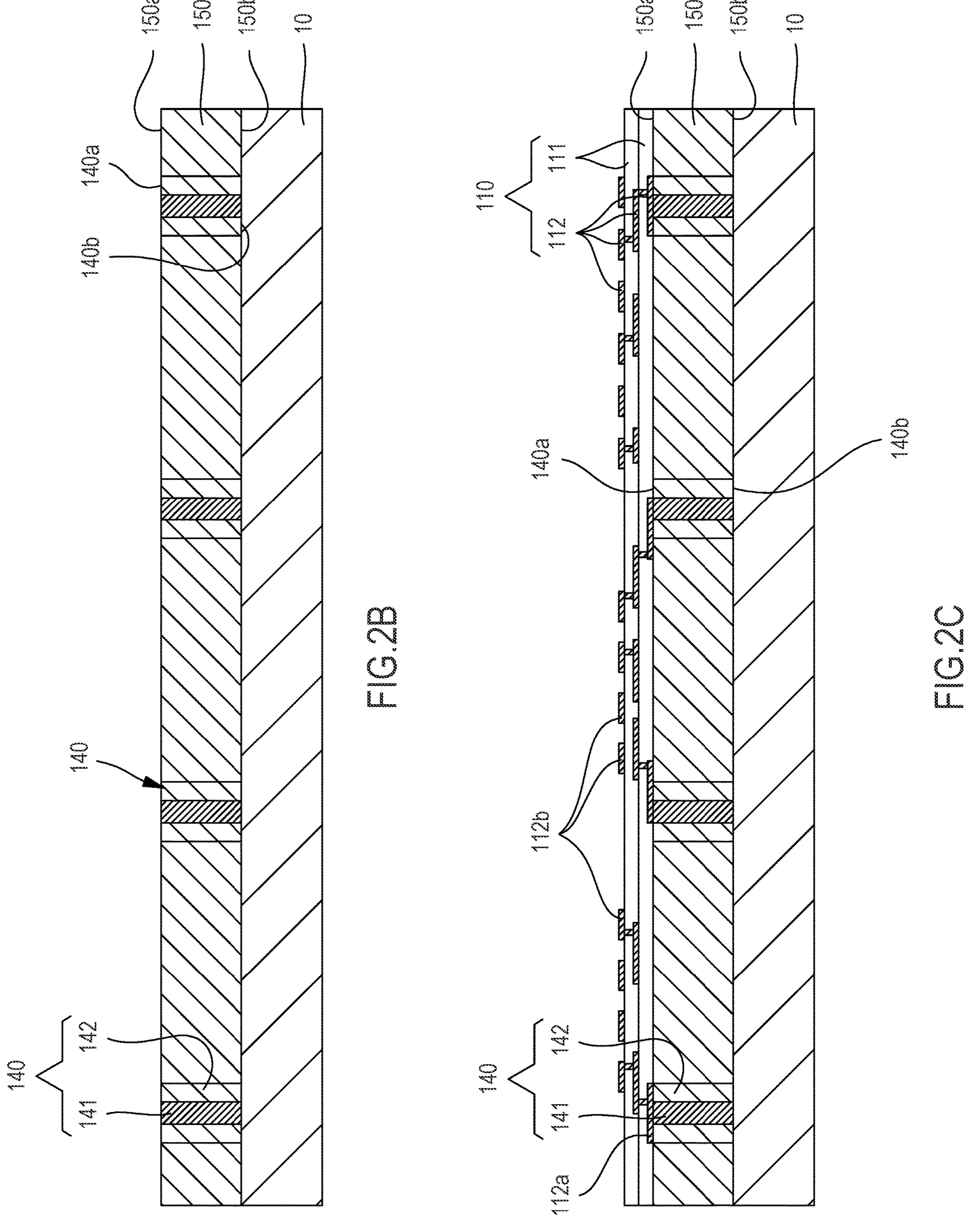

FIG. 2B shows electronic device 100 at a later stage of manufacture. In the example shown in FIG. 2B, encapsulant 150 can be provided to cover one side of carrier 10, side 140*a* of interconnect structure 140, or sidewalls of interconnect structure 140.

In some examples, encapsulant 150 can comprise or be referred to as a body or a molding. For example, encapsulant 150 can comprise an epoxy mold compound, resin, filler-reinforced polymer, B-stage pressed film, or gel. For example, encapsulant 150 can be formed by compression molding, transfer molding, liquid body molding, vacuum lamination, paste printing, or film assist molding.

Side 150*a* of encapsulant 150 can be removed to expose side 140*a* of interconnect structure 140. In some examples, side 150*a* of encapsulant 150 can be removed by grinding. In some examples, when side 150*a* of encapsulant 150 is removed, side 140*a* of interconnect structure 140 can also be removed. Side 150*a* of encapsulant 150 can be coplanar or substantially coplanar with side 140*a* of interconnect structure 140. The thickness of encapsulant 150 and the height of interconnect structure 140 can be similar. Encapsulant 150 can be in contact with one side of carrier 10 and the sidewalls of interconnect structure 140. In some examples, the thickness of encapsulant 150 and interconnect structure 140 can range from approximately 10 μm to approximately 1200 μm.

FIG. 2C shows electronic device 100 at a later stage of manufacture. In the example shown in FIG. 2C, substrate 110 can be provided on side 150*a* of encapsulant 150 and side 140*a* of interconnect structure 140. Substrate 110 can comprise dielectric structure 111 and conductive structure 112.

Inward terminals 112*a* can be provided on side 150*a* of encapsulant 150 and side 140*a* of interconnect structure 140. Inward terminals 112*a* can be provided to have multiple patterns on side 150*a* of encapsulant 150 and side 140*a* of interconnect structure 140. The inward terminals 112*a* can be in contact with or electrically coupled with side 140*a* of interconnect structure 140. Inward terminals 112*a* can comprise or be referred to as conductors, conductive materials, pads, lands, or under-bump-metallurgies (UBMs). In some examples, inward terminals 112*a* can include copper, gold, silver, or nickel. In some examples, inward terminals 112*a* can be provided by plating. For example, after a metal seed layer is provided to cover side 150*a* of encapsulant 150 and side 140*a* of interconnect structure 140, and a mask pattern is provided to cover an external side of the seed layer, inward terminals 112*a* can be provided through plating to have a pattern by using the seed layer as a seed. For example, the mask pattern can use a photoresistor. The mask pattern can be removed after inward terminals 112*a* are formed. In some examples, the thickness of inward terminals 112*a* can range from approximately 1 μm to approximately 20 μm.

Dielectric structure 111 can be provided on inward terminals 112*a*, side 150*a* of encapsulant 150, and side 140*a* of interconnect structure 140. Dielectric structure 111 can be provided to cover inward terminals 112*a*, encapsulant 150, and the side of interconnect structure 140, and then an opening exposing inward terminals 112*a* can be provided. For example, the opening can be formed by forming a mask pattern on the side of dielectric structure 111 and then removing exposed dielectric structure 111 through etching. In some examples, the opening can comprise or be referred to as an aperture or a hole. In some examples, the dielectric structure 111 can comprise or be referred to as a dielectric layer, a coreless layer, or a filler-free layer. For example, dielectric structure 111 can comprise an electrical insulating material such as polyimide (PI), benzocyclobutene (BCB), polybenzoxazole (PBO), resin or Ajinomoto Buildup Film (ABF). In some examples, dielectric structure 111 can be formed by spin coating, spray coating, dip coating, or rod coating. In some examples, the thickness of dielectric structure 111 can range from approximately 5 μm to approximately 50 μm.

Conductive structure 112 can be provided over a side of dielectric structure 111 and inward terminals 112*a*. Conductive structure 112 can be provided to have multiple patterns that can be electrically coupled with inward terminals 112*a*. In some examples, conductive structure 112 can comprise or be referred to as a conductive layer, a trace, a pad, TVS, TGS, a via, a redistribution layer (RDL), a wiring pattern, or a circuit pattern. In some examples, conductive structure 112 can comprise copper, gold, silver, or nickel. In some examples, conductive structure 112 can have corresponding elements, features, materials, or manufacturing methods similar to those of inward terminals 112*a* previously described. Inward terminals 112*a* can be parts of conductive structure 112.

Dielectric structure 111 can have one or more layers. When dielectric structure 111 has multiple layers, conductive structure 112 can be alternately stacked. Conductive structure 112 located on an exterior side of dielectric structure 112*a* can comprise or be referred to as outward terminals 112*b*.

Although a completed substrate 110 is shown as including two-layer dielectric structure 111 and three-layer conductive structure 112, the number of layers for either structure can be less or more than those stated. One or more layers or elements of conductive structure 112 can be interleaved with dielectric structure 111. Inward terminals 112*a* and outward terminals 112*b* can be provided inside and outside substrate 110 to be spaced apart from each other in a row or column direction. In some examples, the overall thickness of the substrate 110 can range from approximately 5 μm to approximately 50 μm.

In some examples, substrate 110 can be a redistribution layer ("RDL") substrate. RDL substrates can comprise one or more conductive redistribution layers and one or more dielectric layers and (a) can be formed layer by layer over an electronic device to where the RDL substrate is to be coupled, or (b) can be formed layer by layer over a carrier and can be entirely removed or at least partially removed after the electronic device and the RDL substrate are coupled together. RDL substrates can be manufactured layer by layer as a wafer-level substrate on a round wafer in a wafer-level process, or as a panel-level substrate on a rectangular or square panel carrier in a panel-level process. RDL substrates can be formed in an additive buildup process and can include one or more dielectric layers alternatingly stacked with one or more conductive layers and define respective conductive redistribution patterns or traces configured to collectively (a) fan-out electrical traces outside the footprint of the electronic device, or (b) fan-in electrical traces within the footprint of the electronic device. The conductive patterns can be formed using a plating process such as, for example, an electroplating process or an electroless plating process. The conductive patterns can comprise a conductive material such as, for example, copper or other plateable metal. The locations of the conductive patterns can be made using a photo-patterning process such as, for example, a photolithography process and a photoresist material to form a photolithographic mask. The dielectric layers of the RDL substrate can be patterned with a photo-patterning process and can include a photolithographic mask through where light is exposed to photo-pattern desired features such as vias in the dielectric layers. The dielectric layers can be made from photo-definable organic dielectric materials such as, for example, polyimide (PI), benzocyclobutene (BCB), or polybenzoxazole (PBO). Such dielectric materials can be spun-on or otherwise coated in liquid form, rather than attached as a pre-formed film. To permit proper formation of desired photo-defined features, such photo-definable dielectric materials can omit structural reinforcers or can be filler-free, without strands, weaves, or other particles, and could interfere with the light from the photo-patterning process. In some examples, such filler-free characteristics of filler-free dielectric materials can permit a reduction of the thickness of the resulting dielectric layer. Although the photo-definable dielectric materials described above can be organic materials, in some examples the dielectric materials of the RDL substrates can comprise one or more inorganic dielectric layers. Some examples of one or more inorganic dielectric layers can comprise silicon nitride (Si3N4), silicon oxide (SiO2), or silicon oxynitride (SiON). The one or more inorganic dielectric layers can be formed by growing the inorganic dielectric layers using an oxidation or nitridization process instead using photo-defined organic dielectric materials. Such inorganic dielectric layers can be filler-fee, without strands, weaves, or other dissimilar inorganic particles. In some examples, the RDL substrates can omit a permanent core structure or carrier such as, for example, a dielectric material comprising bismaleimide triazine (BT) or FR4 and these types of RDL substrates can comprise or be referred to as a coreless substrate. Other substrates in this disclosure can also comprise an RDL substrate.

In some examples, substrate 110 can be a pre-formed substrate. The pre-formed substrate can be manufactured prior to attachment to an electronic device and can comprise dielectric layers between respective conductive layers. The conductive layers can comprise copper and can be formed using an electroplating process. The dielectric layers can be relatively thicker non-photo-definable layers that can be attached as a pre-formed film rather than as a liquid and can include a resin with fillers such as strands, weaves, or other inorganic particles for rigidity or structural support. Since the dielectric layers are non-photo-definable, features such as vias or openings can be formed by using a drill or laser. In some examples, the dielectric layers can comprise a prepreg material or Ajinomoto Buildup Film (ABF). The pre-formed substrate can include a permanent core structure or carrier such as, for example, a dielectric material comprising bismaleimide triazine (BT) or FR4, and dielectric and conductive layers can be formed on the permanent core structure. In other examples, the pre-formed substrate can be a coreless substrate which omits the permanent core structure, and the dielectric and conductive layers can be formed on a sacrificial carrier that is removed after formation of the dielectric and conductive layers and before attachment to the electronic device. The pre-formed substrate can be referred to as a printed circuit board (PCB) or a laminate substrate. Such pre-formed substrate can be formed through a semi-additive or modified-semi-additive process. Other substrates in this disclosure can also comprise a pre-formed substrate.

Figures 2D, 2E:
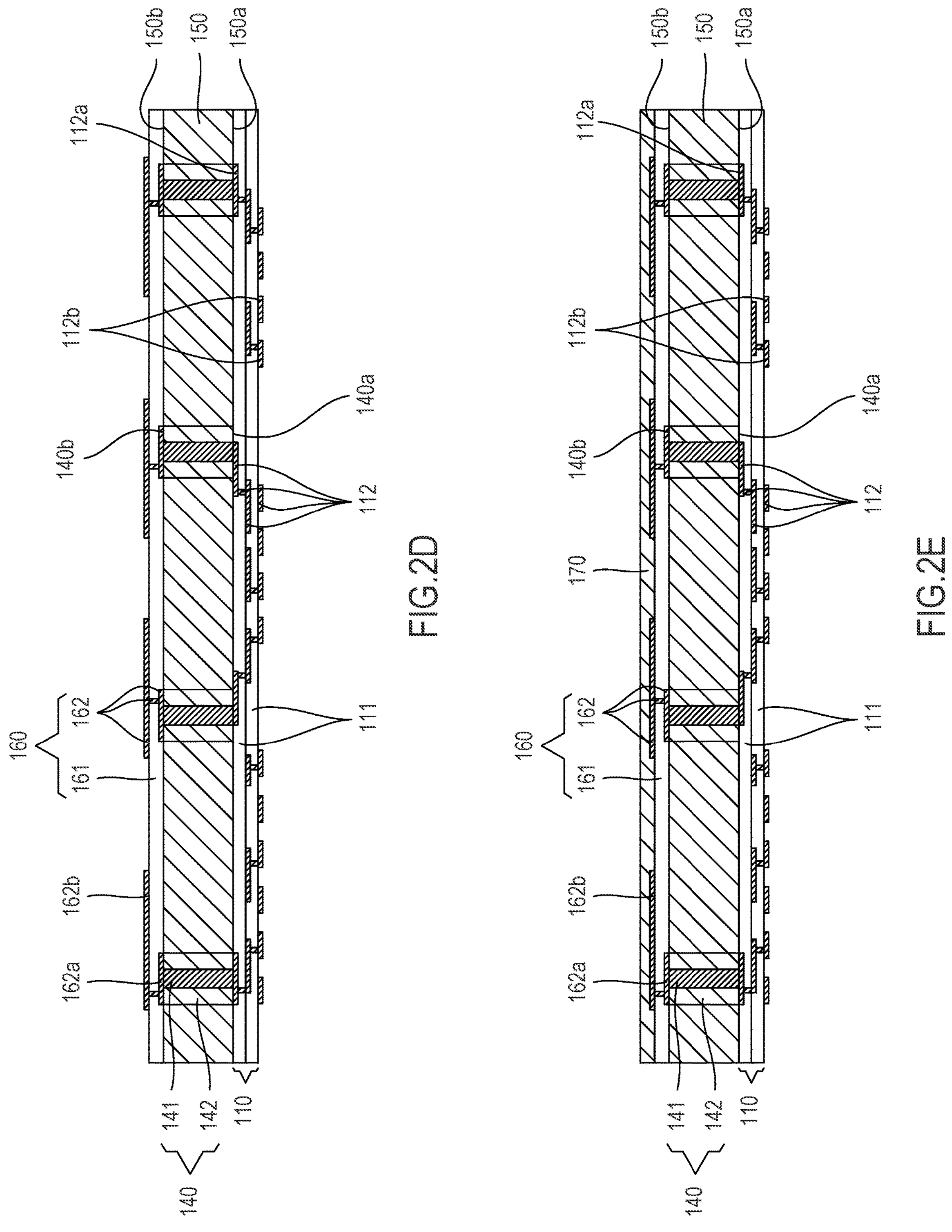

FIG. 2D shows electronic device 100 at a later stage of manufacture. In the example shown in FIG. 2D, substrate 160 can be provided on side 150*b* of encapsulant 150 and side 140*b* of interconnect structure 140.

Before substrate 160 is provided, carrier 10 can be separated from side 150*b* of encapsulant 150 and side 140*b* of interconnect structure 140. In some examples, after heat, light, a chemical solution, or physical external force is provided to remove or reduce the adhesive force of the temporary bond layer interposed between carrier 10 and encapsulant 150 and between carrier 10 and interconnect structure 140, carrier 10 can be separated from side 150*b* of encapsulant 150 and side 140*b* of interconnect structure 140. The temporary bond layer of carrier 10 can be separated from encapsulant 150 and interconnect structure 140 in a state where the temporary bond layer is attached to carrier 10. Carrier 10 can be removed, and side 150*b* of encapsulant 150 and side 140*b* of interconnect structure 140 can be exposed.

Electronic device 100 shown in FIG. 2D can be flipped from the orientation shown in FIG. 2C, and substrate 110 can be positioned under encapsulant 150 and interconnect structure 140. Electronic device 100 can be flipped so side 150*a* and side 150*b* of encapsulant 150 become inverted with respect to each other, and side 140*a* and side 140*b* of interconnect structure 140 likewise become inverted with respect to each other.

Substrate 160 can comprise dielectric structure 161 and conductive structure 162. Conductive structure 162 can comprise inward terminals 162*a* and outward terminals 162*b*. In some examples, substrate 160 can comprise an RDL substrate. In other examples, substrate 160 can comprise a pre-formed substrate.

Inward terminals 162*a* can be provided on side 150*b* of encapsulant 150 and side 140*b* of interconnect structure 140. Inward terminals 162*a* can be provided to have patterns on side 150*b* of encapsulant 150 and side 140*b* of interconnect structure 140. Inward terminals 162*a* can have corresponding elements, features, materials, or manufacturing methods similar to those of inward terminals 112*a*.

Dielectric structure 161 can be provided on inward terminals 162*a*, side 150*b* of encapsulant 150, and side 140*b* of interconnect structure 140. Dielectric structure 161 can have corresponding elements, features, materials, or manufacturing methods similar to those of dielectric structure 161.

Conductive structure 162 can be provided to cover an external side of dielectric structure 161 and inward terminals 162*a*. Conductive structure 162 can be provided to have multiple patterns, wherein the patterns can be electrically coupled with interconnect structure 140 through inward terminals 162*a*. In some example, conductive structures 162 can have corresponding elements, features, materials, or manufacturing methods similar to those of inward terminals 162*a* described above. Conductive structure 162 located on an external side of dielectric structure 161 can comprise outward terminals 162*b*. Outward terminals 162*b* of conductive structure 162 can comprise or be referred to as antenna patterns. In some examples, antenna patterns 162*b* can comprise or be referred to as dipole antennas, monopole antennas, patch antennas, loop antennas, beam antennas, doublet antennas, folded antennas, rhombic antennas, or half wave antennas. Since antenna patterns 162*b* are provided by RDL, fine size adjustment can be achieved and distance control between antenna patterns 162*b* can be achieved.

Although completed substrate 160 is shown as including a one-layer dielectric structure 161 and a two-layer conductive structure 162, the number of layers of either structure can be less or more than those stated. One or more layers or elements of conductive structure 162 can be interleaved with dielectric structure 161. Inward terminals 162*a* and outward terminals 162*b* can be provided inside and outside the substrate 160 to be spaced apart from each other in a row or column direction. In some examples, the overall thickness of substrate 160 can range from approximately 5 μm to approximately 50 μm.

FIG. 2E shows electronic device 100 at a later stage of manufacture. In the example shown in FIG. 2E, encapsulant 170 can be provided to cover an external side of substrate 160. Encapsulant 170 can be provided to cover dielectric structure 161 of substrate 160 and outward terminals 162*b*. Encapsulant 170 can have corresponding elements, features, materials, or manufacturing methods similar to those of encapsulant 150. In some examples, encapsulant 170 can comprise a first material and dielectric structure 161 can comprise a second material different than the first material. Encapsulant 170 can protect external terminal 162*b* from external environments. In some examples, the thickness of encapsulant 170 can range from approximately 5 μm to approximately 15 μm.

Figures 2F, 3:
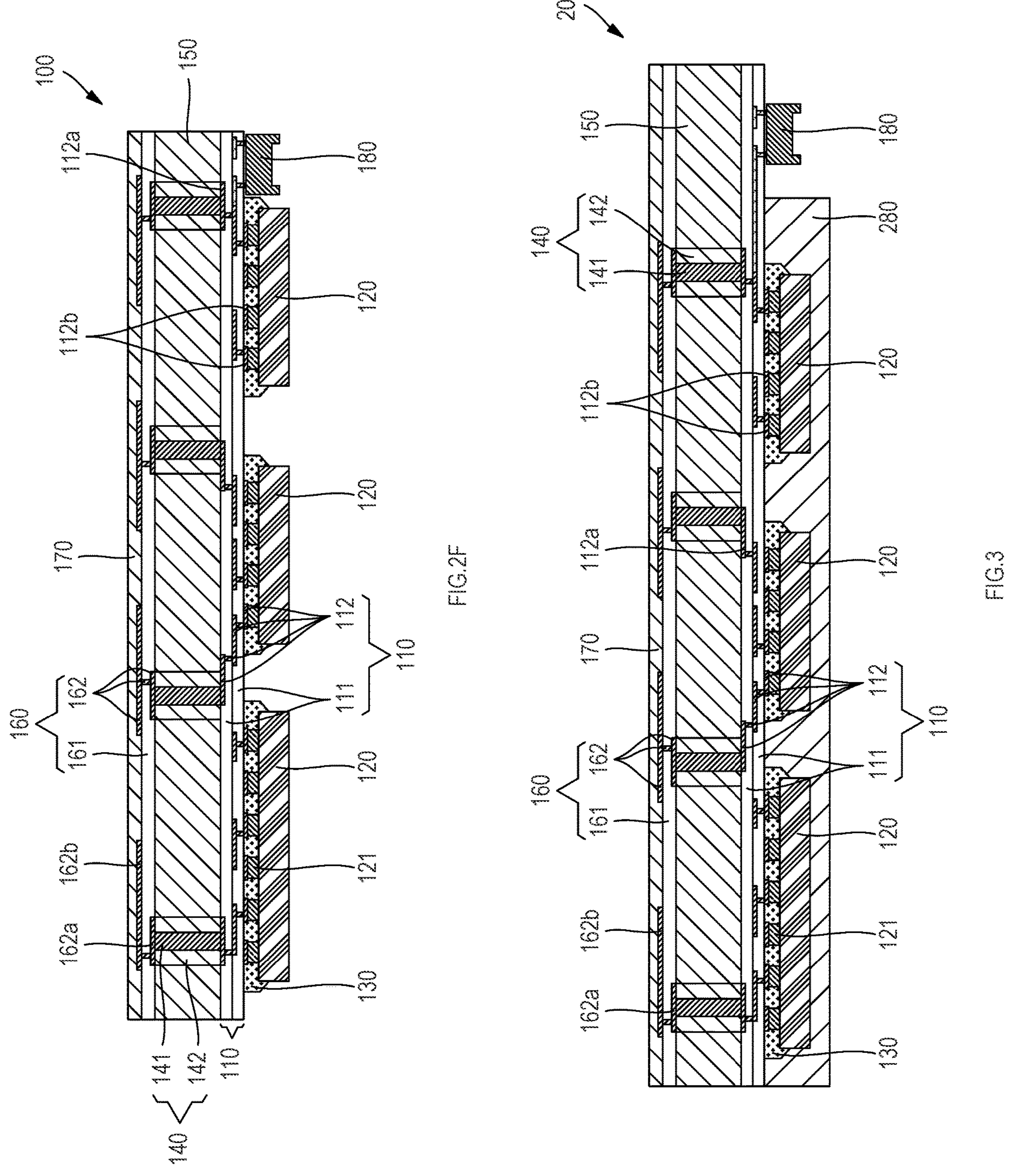
FIG. 3 shows a cross-sectional view of an example electronic device.

FIG. 2F shows electronic device 100 at a later stage of manufacture. In the example shown in FIG. 2F, electronic component 120 can be provided outside substrate 110. Electronic component 120 can be in contact with and be electrically coupled with outward terminals 112*b* of substrate 110. In some examples, one side of electronic component 120 can comprise or be referred to as an inactive side, and the opposite side of electronic component 120 can comprise or be referred to as an active side. Electronic component 120 can comprise component interconnect 121 on the active side of electronic component 120. Component interconnects 121 can be provided on the active side of electronic component 120 so as to be spaced apart from each other in a row or column direction. Component interconnects 121 can comprise or be referred to as bumps, pads, or pillars. Component interconnects 121 can be input/output terminals of electronic component 120. In some examples, component interconnects 121 can be applied on the active side of electronic component 120 by electroplating, electroless plating, sputtering, PVD, CVD, MOCVD, ALD, LPCVD, or PECVD. For example, after providing a photoresist pattern exposing bond pads of electronic component 120, component interconnects 121 can be provided to be in contact with exposed bond pads. In some examples, the thickness of component interconnects 121 can range from approximately 1 μm to approximately 35 μm, and the width and pitch can range from approximately 10 μm to approximately 50 μm.

In some examples, pick-and-place equipment can pick up electronic component 120 or connector 180 and placed outside substrate 110. In such examples, substrate 110 of electronic device 100 can be located on side 150*a* of encapsulant 150. Component interconnects 121 of electronic component 120 can be located on an external side of outward terminals 112*b* of first board 110. Subsequently, component interconnects 121 of electronic component 120 can be in contact with and bonded to outward terminals 112*b* through a reflow or thermal compression bonding process. In some examples, electronic component 120 can comprise or be referred to as a die, a chip, or a package. Similarly, connector 180 can be coupled with conductive structure 112. Electronic component 120 or connector 180 can be electrically coupled with antenna patterns 162*b* of substrate 160 through conductive structure 112 and interconnect structure 140 of substrate 110.

Underfill 130 can be positioned between electronic component 120 and substrate 110. Underfill 130 can be in contact with the active side of electronic component 120 and the outer side of substrate 110. Underfill 130 can be in contact with component interconnects 121 of electronic component 120. Underfill 130 can comprise or be referred to as a dielectric layer or a non-conductive paste and can be free of inorganic fillers. In some examples, underfill 130 can comprise or be referred to as capillary underfill (CUF), nonconductive paste (NCP), nonconductive film (NCF), Anisotropic Conductive Film (ACF), or Anisotropic Conductive paste (ACP). In some examples, when underfill 130 comprises a molded underfill (MUF), electronic component 120 can be covered by an encapsulant, and underfill 130 can be considered a part of the encapsulant. In some examples, underfill 130 can be cured after being positioned between electronic component 120 and substrate 110. In some examples, after underfill 130 is provided to cover the inside of substrate 110, component interconnect 121 of electronic component 120 can pass through underfill 130 and be coupled with outward terminals 112*b*. Underfill 130 can prevent electronic component 120 from being separated from substrate 110 due to physical or chemical impact.

Although electronic component 120 is shown as having a face-down or flip-chip configuration, electronic component 120 can have a face-up or wire bonding configuration. For example, electronic component 120 can comprise an inactive side on one side and can comprise an active side on the opposite side. Electronic component 120 can be bonded with substrate 110. In electronic component 120, component terminals can be positioned at the active side. The component terminals of electronic component 120 can be electrically coupled with outward terminals 112*b* of substrate 110 through component interconnects 121. Component interconnects 121 can comprise or be referred to as conductive wires. For example, conductive wires can bond the component terminals of electronic component 120 to outward terminals 112*b* of substrate 110 through wire bonding equipment by using gold wires, copper wires, or aluminum wires. In some examples, the overall thickness of electronic component 120 can range from approximately 20 μm to approximately 50 μm, and the area can range from approximately 0.5 millimeters (mm)×0.5 mm to approximately 70 mm×70 mm.

In some examples, a singulation process for separating into individual electronic elements 100 by sawing substrates 110 and 160 and encapsulants 150 and 170 can be performed. Electronic device 100 can comprise substrates 110 and 160, electronic components 120, underfill 130, interconnect structure 140, and encapsulants 150 and 170. Since electronic device 100 can be provided by RDL in substrate 160, fine size adjustment can be achieved and distance control between patterns can be facilitated. By comprising encapsulant 170, electronic device 100 can protect antenna patterns 162*b* from external environments.

FIG. 3 shows a cross-sectional view of an example electronic device 200. In the example shown in FIG. 3, electronic device 200 can comprise substrate 110, substrate 160, electronic component 120, underfill 130, interconnect structure 140, encapsulant 150, encapsulant 170, and encapsulant 280.

Electronic Device 200 can be similar to electronic device 100. For example, electronic device 200 can be similar to electronic device 100 with respect to substrate 110, substrate 160, electronic component 120, underfill 130, interconnect structure 140, encapsulant 150, and encapsulant 170. Electronic device 200 of FIG. 4 can comprise encapsulant 280. Encapsulant 280 can be coupled with an outward side of substrate 110 and can contact a lateral side of electronic component 120.

Encapsulant 280 can be provided to cover an outer side of electronic component 120, a lateral side of electronic component 120, underfill 130, or substrate 110. Encapsulant 280 can be in contact with the outer side of substrate 110, the sidewalls and inactive side of electronic component 120, and the sidewalls of underfill 130. Encapsulant 280 can protect electronic component 120 from external elements. Encapsulant 280 can have corresponding elements, features, materials, or manufacturing methods similar to those of encapsulant 150. In some examples, an exterior side of encapsulant 280 can be removed to expose the inactive side of electronic component 120. In some examples, the thickness of encapsulant 280 can range from approximately 100 μm to approximately 1200 μm.

In some examples, electronic device 200 can include port or connector 180 coupled with conductive structure 112 of substrate 110. Connector 180 can be used to couple electronic device 200 to another electronic device, for example via an interconnect, cable, or printed circuit board (PCB) which can comprise a flexible PCB in some examples. In the example shown in FIG. 3, encapsulant 280 does not cover a portion of substrate 110 where connector 180 is coupled with substrate 110 and uncovered by encapsulant 280. In some examples, connector 180 can be omitted. In such examples, encapsulant 280 can extend to the lateral side of substrate 110.

Figures 4, 5:
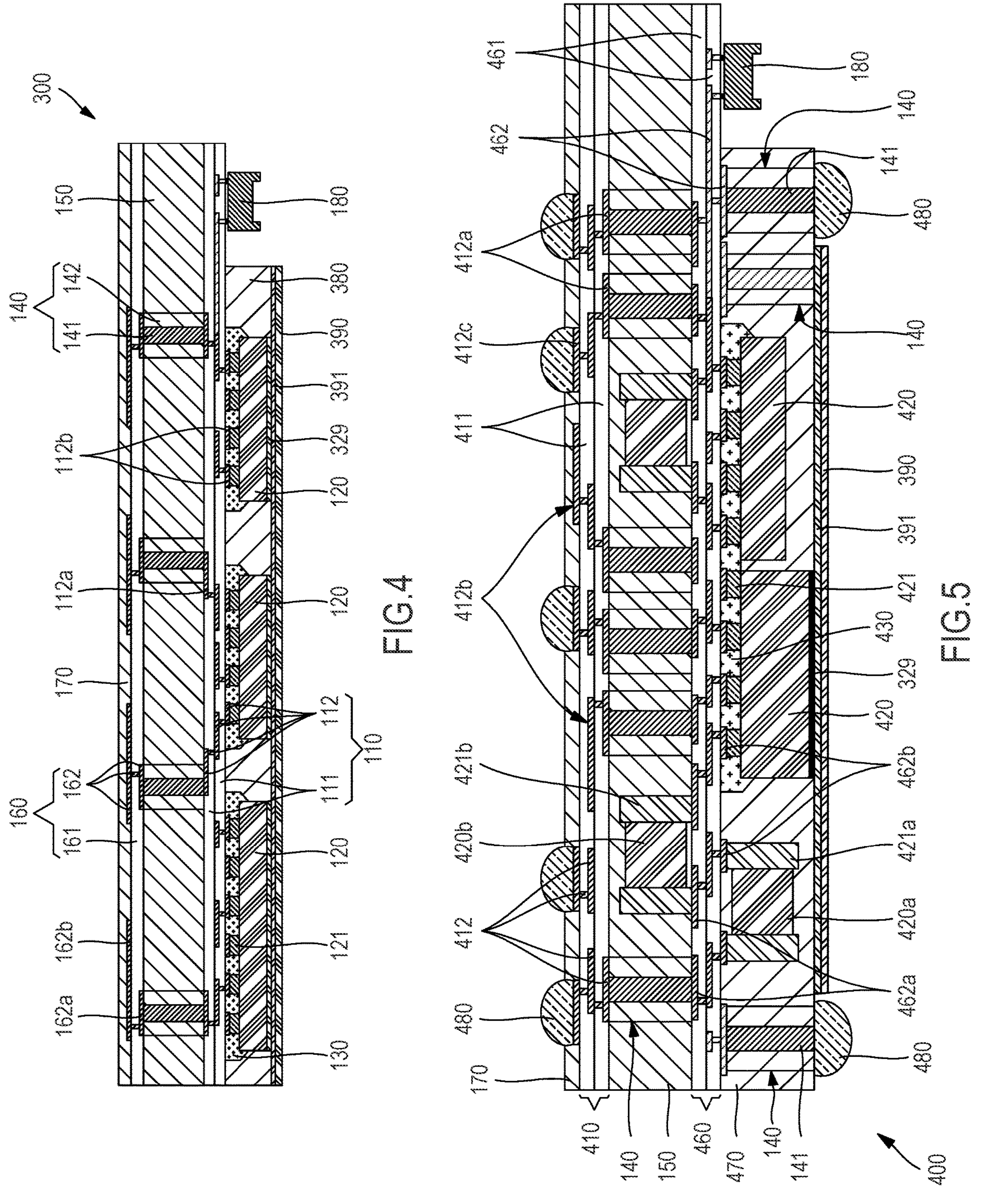
FIG. 4 shows a cross-sectional view of an example electronic device.
FIG. 5 shows a cross-sectional view of an example electronic device.

FIG. 4 shows a cross-sectional view of an example electronic device 300. In the example shown in FIG. 4, electronic device 300 can comprise substrate 110, substrate 160, electronic component 120, underfill 130, interconnect structure 140, encapsulant 150, encapsulant 170, encapsulant 380, and lid 390.

Electronic device 300 can be similar to electronic device 100. For example, electronic device 300 can be similar to electronic device 100 with respect to substrate 110, substrate 160, electronic component 120, underfill 130, interconnect structure 140, encapsulant 150, and encapsulant 170. Electronic device 300 can comprise encapsulant 380 and lid 390. In some examples, lid 390 can be coupled with an outward side of encapsulant 380.

Encapsulant 380 can be provided to cover the outside of electronic component 120, underfill 130, and substrate 110. Encapsulant 380 can be in contact with the outer side of substrate 110, the sidewalls of electronic component 120, and the sidewalls of underfill 130. An external side of encapsulant 380 can be removed to expose the inactive side of electronic component 120. Encapsulant 380 can protect electronic component 120 from external elements. Encapsulant 380 can have corresponding elements, features, materials, or manufacturing methods similar to those of encapsulant 150. In some examples, the thickness of encapsulant 380 can range from approximately 100 μm to approximately 1200 μm.

Lid 390 can be an approximately rectangular plate. Lid 390 can be made of a metal having high heat conductivity and high radiation. In some examples, lid 390 can include aluminum or copper. In some examples, lid 390 can comprise or be referred to as a shield, a heatsink, a heat dissipation plate, or a cover. In some examples, lid 390 can easily release heat generated from electronic component 120 and prevent inflow of electromagnetic waves. In some examples, thermal interface material (TIM) 391 can be interposed between the inside of lid 390 and the inactive side of electronic component 120. TIM 391 can comprise a heat conductive material, such as a metal material such as solder or solder paste. Examples of such thermal interface materials include metal alloy materials, such as gallium, gallium alloys (e.g., alloys with indium, tin, and zinc), silver alloys, tin-silver, indium, and indium alloys. Thermal interface material 391 can more easily deliver heat generated from electronic component 120 to lid 390. In some examples, electronic component 120 can comprise metal layer 129 in contact with the inactive side. Metal layer 329 can be interposed between the inactive side of electronic component 120 and TIM 391. In some examples, metal layer 329 can be coupled with TIM 329. Metal layer 329 can comprise or be referred to as a backside metallization (BSM) plating layer, a conductive film, or a conductive film. For example, metal layer 329 can be provided on the inactive side of the electronic component 120 by electroplating, electroless plating, sputtering, or PVD. In some examples, metal layer 329 can be made of gold (Au) or silver (Ag). In some examples, the thickness of the metal layer 329 can range from approximately 0.3 μm to approximately 3 μm.

In some examples, electronic device 300 can include port or connector 180 coupled with conductive structure 112 of substrate 110. Connector 180 can be used to couple electronic device 300 to another electronic device, for example via an interconnect, cable, or printed circuit board (PCB) which can comprise a flexible PCB in some examples. In the example shown in FIG. 4, encapsulant 380, lid 390, and TIM 391 do not cover a portion of substrate 110 where connector 180 is coupled with substrate 110 and uncovered by encapsulant 380, lid 390, and TIM 391. In some examples, connector 180 can be omitted. In such examples, encapsulant 380, lid 390, and TIM 391 can extend to the lateral side of substrate 110.

FIG. 5 shows a cross-sectional view of an example electronic device 400. In the example shown in FIG. 5, electronic device 400 can comprise substrate 410, substrate 460, electronic component 420, electronic component 420*a*, electronic component 420*b*, underfill 430, interconnect structure 140, encapsulant 150, encapsulant 470, and external interconnects 480.

Electronic device 400 can be similar to electronic device 100. For example, electronic device 400 can be similar to electronic device 100 with respect to interconnect structure 140 and encapsulant 150. Electronic device 400 can comprise substrate 410, substrate 460, electronic component 420, electronic component 420*a*, electronic component 420*b*, underfill 430, encapsulant 470, and external interconnects 480. Although electronic device 400 is shown in one particular orientation where substrate 410 is towards the top or faces towards the top, there can be examples where electronic device 400 can be oriented or mounted in another orientation where substrate 410 is towards the bottom or faces towards the bottom.

Substrate 410 can comprise dielectric structure 411 and conductive structure 412. Conductive structure 412 can comprise inward terminals 412*a*, outward terminals 412*c*, or antenna patterns 412*b*. Substrate 460 can comprise dielectric structure 461 and conductive structure 462. Conductive structure 462 can comprise inward terminals 462*a* and outward terminals 462*b*. Electronic component 420, electronic component 420*a*, and electronic component 420*b* can comprise component interconnects 421, component interconnects 421*a*, and component interconnects 421*b*. Electronic component 420 can be at the outward side of substrate 460 and can be coupled with conductive structure 462. One or more interconnect structures 140 can be between the inward side of substrate 410 and at the inward side of substrate 460 and can be coupled with conductive structure 412 and conductive structure 462. Encapsulant 150 can contact a lateral side of interconnect structure 140. In some examples, electronic component 420*a* can be coupled with conductive structure 462 of substrate 460. Encapsulant 470 can be over the outward side of substrate 460 and can contact a lateral side of electronic component 420. Electronic component 420*a* can be coupled with the outward side of substrate 460 and can be in encapsulant 470. One or more interconnect structures 140 can be coupled to conductive structure 462 at the outward side of substrate 460. One or more of such interconnect structures 140 can extend to be coupled with external interconnects 480 or with TIM 391 or lid 390. In some examples, electronic component 420*b* can be coupled with the inward side of substrate 460 and can be in encapsulant 150. In some examples, electronic component 420*b* can be coupled with conductive structure 462. In some examples, electronic component 420*b* can be at least partially within or fully within a footprint of electronic component 420 or a footprint of adjacent electronic components 420. In some examples, electronic component 420*a* and electronic component 420*b* can be on opposite sides of substrate 460.

In some examples, encapsulant 170 can be over the outward side of substrate 410 or can at least partially cover lateral sides of external interconnects 480. In some examples, external interconnects 480 at one side of electronic device 400, for example on or adjacent substrate 410, can be omitted. In some examples, external interconnects 480 at the opposite side of electronic device 400, for example on or adjacent encapsulant 470, can be omitted. In some examples, lid 390 or TIM 391 can extend to cover the entire outward side of encapsulant 470 or can extend from a lateral edge, such as the left edge, to an opposite lateral edge, such as the right edge, of encapsulant 470, for example to provide heat dissipation via TIM 391 or to provide electromagnetic shielding by lid 390. Lid 390 optionally can be coupled with metal interconnect 141 of one or more interconnect structures 140 in some examples, such as for shielding. In some examples, TIM 391 can be omitted, and in some examples lid 390 can be omitted.

In some examples, electronic device 400 can include port or connector 180 coupled with conductive structure 112 of substrate 110. Connector 180 can be used to couple electronic device 400 to another electronic device, for example via an interconnect, cable, or printed circuit board (PCB) which can comprise a flexible PCB in some examples. In the example shown in FIG. 5, encapsulant 470, lid 390, and TIM 391 do not cover a portion of substrate 460 adjacent to where connector 180 is coupled, such that connector 180 or the adjacent portion of substrate 460 remains uncovered by encapsulant 470, lid 390, and TIM 391. In some examples, connector 180 can be omitted. In such examples, encapsulant 470 can extend to the lateral side of substrate 460.

Figures 6A, 6B:
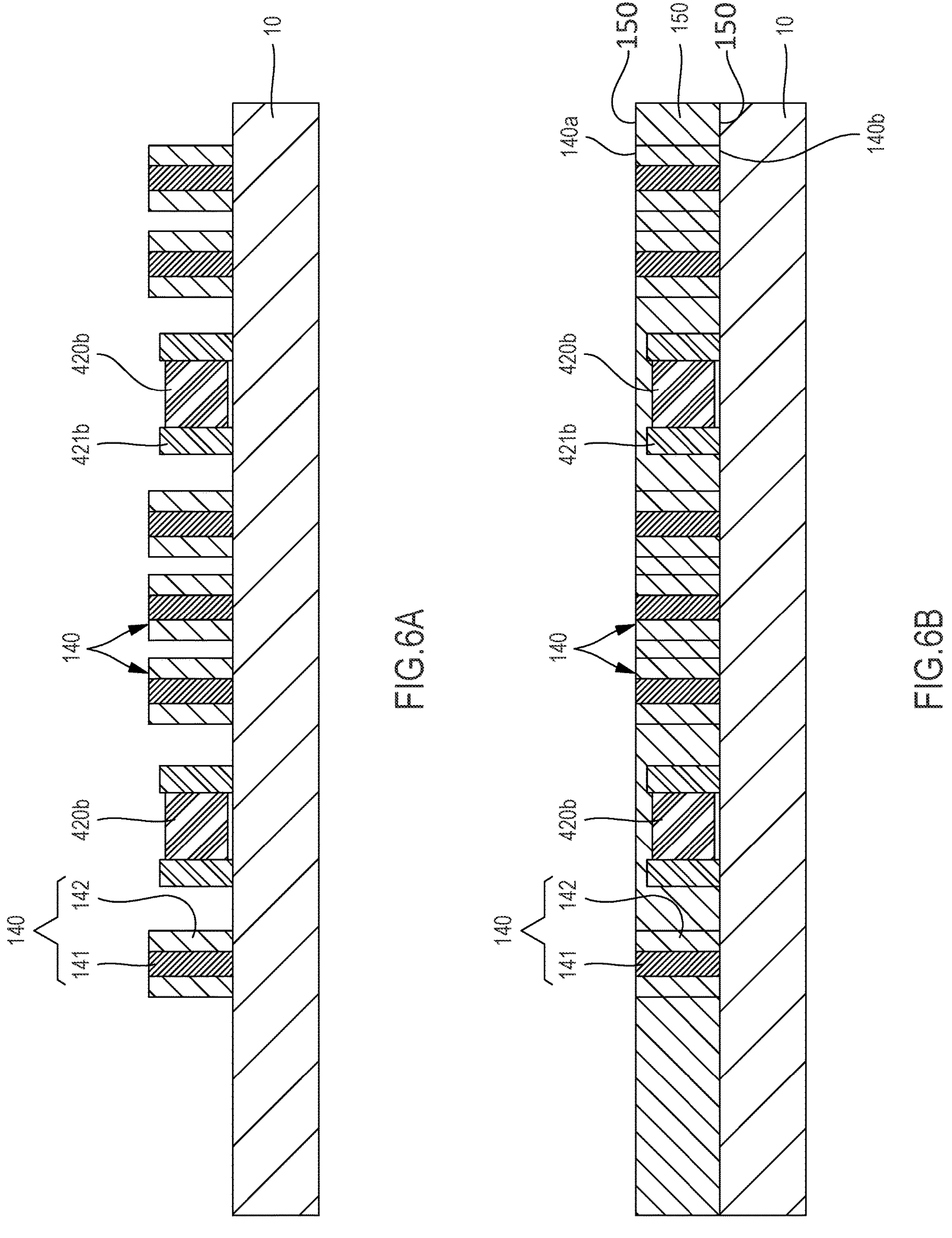
FIGS. 6A to 6G show cross-sectional views of an example method for manufacturing an example electronic device.

FIGS. 6A to 6G show cross-sectional views of an example method for manufacturing an example electronic device. FIG. 6A shows electronic device 400 at an early stage of manufacture. In the example shown in FIG. 6A, interconnect structure 140 and electronic component 420*b* can be provided on carrier 10. Carrier 10 and interconnect structure 140 can have corresponding elements, features, materials, or manufacturing methods similar to those of carrier 10 and interconnect structure 140 in the manufacture of electronic device 100 described with reference to FIG. 2A.

Electronic component 420*b* can comprise or be referred to as a passive component. In some examples, electronic component 420*b* can comprise or be referred to as a decoupling capacitor. Electronic component 420*b* can comprise component interconnects 421*b* coupled to carrier 10. Electronic component 420*b* can include one or more than two electronic components. Component interconnects 421*b* of electronic component 420*b* can be adhered and fixed to carrier 10. For example, electronic component 420*b* can be picked up by pick-and-place equipment to be seated and bonded to carrier 10. Electronic component 420*b* can be attached on carrier 10 to be spaced apart from interconnect structure 140. In some examples, the height of electronic component 420*b* can be smaller than the height of interconnect structure 140. Electronic component 420*b* can be mounted between interconnect structures 140 to prevent an increase in the size of electronic device 400 occurring during stacking. In some examples, the height of electronic component 420*b* can range from approximately 50 μm to approximately 120 μm.

FIG. 6B shows electronic device 400 at a later stage of manufacture. In the example shown in FIG. 6B, encapsulant 150 can be provided to cover carrier 10, interconnect structure 140, and electronic component 420*b*. Encapsulant 150 can be in contact with the carrier 10, the sidewalls of interconnect structure 140, and the sidewalls and electronic component 420*b*. Side 140*a* of interconnect structure 140 can be exposed from encapsulant 150. Encapsulant 150 can have corresponding elements, features, materials, or manufacturing methods similar to those of encapsulant 150 described with reference to FIG. 2B.

Figures 6C, 6D:
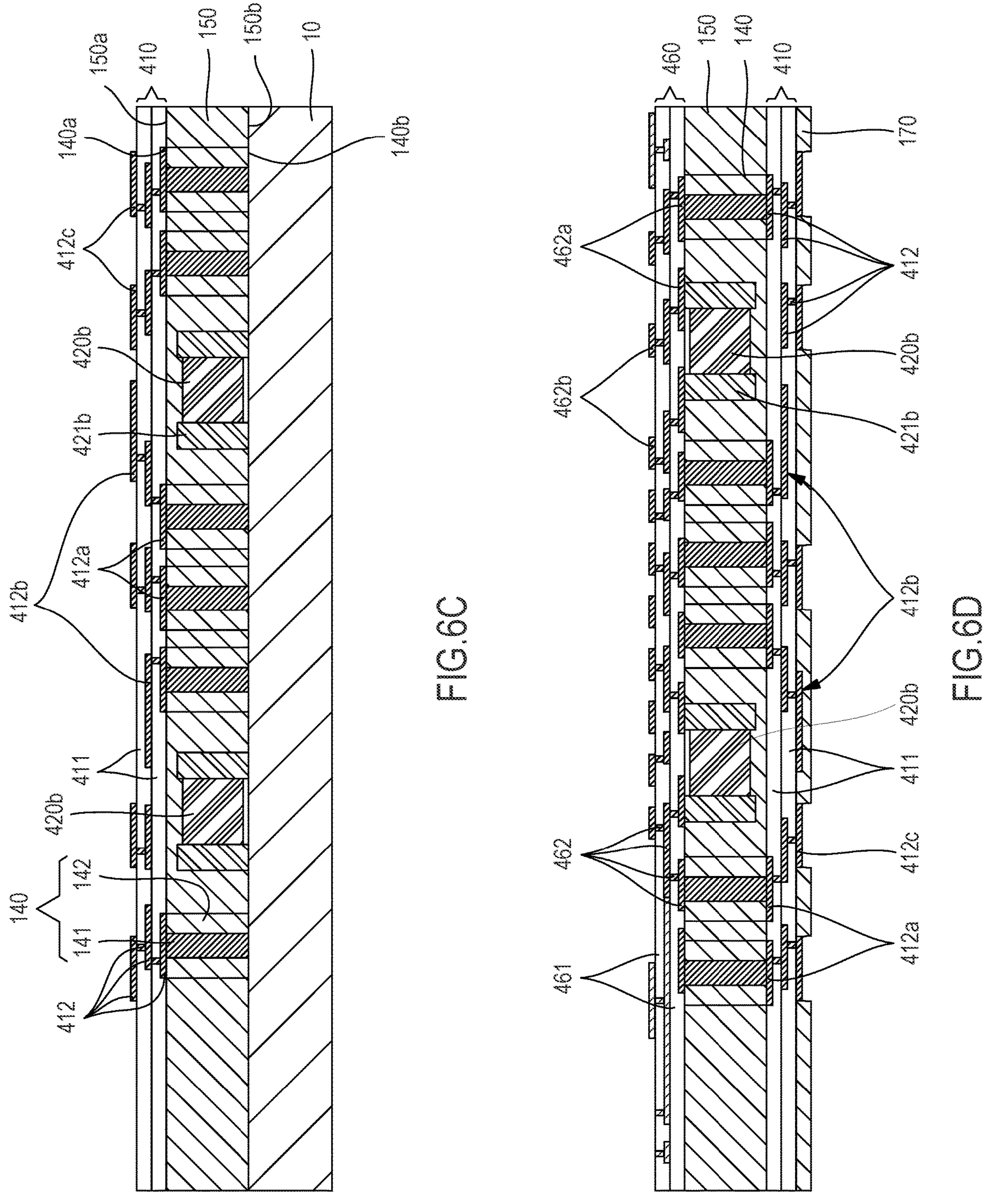

FIG. 6C shows electronic device 400 at a later stage of manufacture. In the example shown in FIG. 6C, substrate 410 can be provided on side 150*a* of encapsulant 150 and side 140*a* of interconnect structure 140.

Substrate 410 can comprise dielectric structure 411 and conductive structure 412. Conductive structure 412 can comprise inward terminals 412*a* and outward terminals 412*c*. Substrate 410 can have corresponding elements, features, materials or manufacturing methods similar to those of substrate 110 described with reference to FIG. 2C. In some examples, substrate 410 can comprise an RDL substrate. In other examples, substrate 410 can comprise a pre-formed substrate.

FIG. 6D shows electronic device 400 at a later stage of manufacture. In the example shown in FIG. 6D, substrate 460 can be provided on side 150*b* of encapsulant 150, on side 140*b* of interconnect structure 140, and on electronic component 420*b*.

Before substrate 460 is provided, carrier 10 can be separated from side 150*b* of encapsulant 150, side 140*b* of interconnect structure 140, and component interconnects 421*b* of electronic component 420*b*. Separation of carrier 10 can include a process similar to that described with reference to FIG. 2D. In some examples, substrate 460 can comprise an RDL substrate. In other examples, substrate 460 can comprise a pre-formed substrate.

Electronic device 400 shown in FIG. 6D can be flipped so substrate 410 can be positioned under encapsulant 150, electronic component 420*b*, and interconnect structure 140. Substrate 460 can comprise dielectric structure 461 and conductive structure 462. Conductive structure 462 can comprise inward terminals 462*a* and outward terminals 462*b*. Substrate 460 can have corresponding elements, features, materials, or manufacturing methods similar to those of substrate 410 described with reference to FIG. 2D. Interconnect structure 140 and component interconnects 421*b* of electronic component 420*b* can be coupled with internal terminals 462*a* of substrate 460.

Figures 6E, 6F:
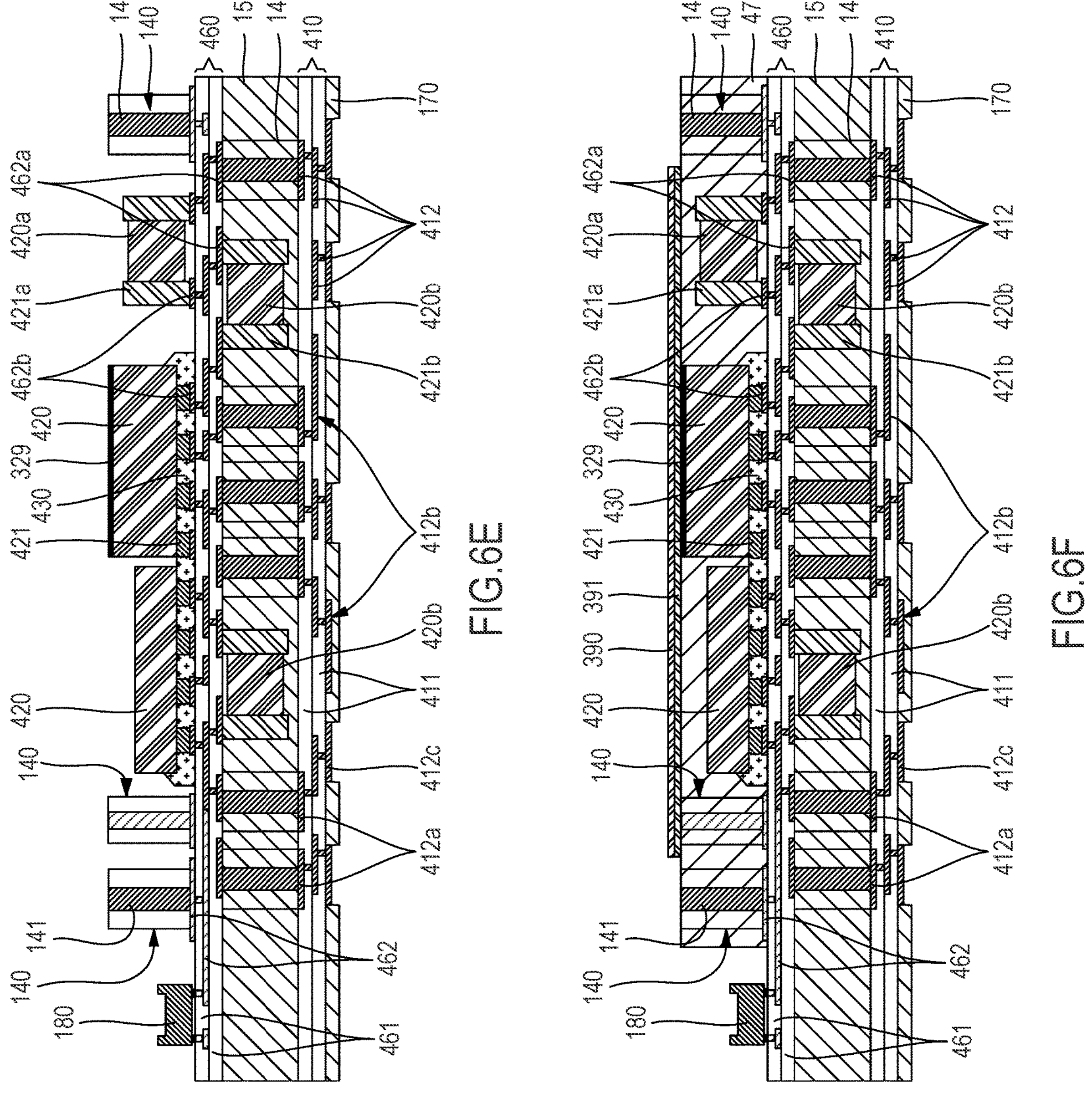

FIG. 6E shows electronic device 400 at a later stage of manufacture. In the example shown in FIG. 6E, electronic component 420 and electronic component 420*a* can be provided on substrate 460. Electronic component 420 and electronic component 420*a* can be coupled with outward terminals 462*b* of substrate 460. Electronic component 420 and electronic component 420*a* can be located on substrate 460 adjacent to each other. Electronic component 420 can have corresponding elements, features, materials, or manufacturing methods similar to those of electronic component 120. Electronic component 420*a* can have corresponding elements, features, materials, or manufacturing methods similar to those of electronic component 420*b*.

Electronic component 420 can be located above electronic component 420*b* at opposite sides of substrate 460. Because electronic component 420*b* can be located within or overlapping a footprint of electronic component 420, or within or overlapping a footprint of electronic component of adjacent electronic components 420, an area size of electronic device 400 can be reduced.

Electronic component 420 can be coupled with electronic component 420*a* and electronic component 420*b* through conductive structure 462 of substrate 460. In some examples, when electronic component 420*a* and electronic component 420*b* are decoupling capacitors, by being mounted closer adjacent to electronic component 420, noise removal can be enhanced. When a power line and a ground line are disposed within substrate 460, electronic component 420, electronic component 420*a*, and electronic component 420*b* can have low loop inductance. Electronic component 420, electronic component 420*a*, and electronic component 420*b* can be coupled with substrate 410 through interconnect structure 140. Connector 180 also can be provided and coupled with conductive structure 462 in a similar manner as described with respect to FIG. 2F.

FIG. 6F shows electronic device 400 at a later stage of manufacture. In the example shown in FIG. 6F, encapsulant 470 can be provided to cover electronic components 420 and 420*a* and the outward of substrate 460. Encapsulant 470 can be in contact with the outward side and sidewalls of electronic component 420 and the outward side and sidewalls of electronic component 420*a*. Encapsulant 470 can cover dielectric structure 461 and outward terminals 462*b* of substrate 460. In some examples, encapsulant 470 can have corresponding elements, features, materials, or manufacturing methods similar to those of encapsulant 150 of electronic device 100 or encapsulant 280 of electronic device 200. In some examples, encapsulant 470 can expose the outward side of electronic component 420 or its corresponding metal layer 329. In some examples, TIM 391 or lid 390 can be provided on encapsulant 470 or metal layer 329, similar to the structure of encapsulant 380 of electronic device 300. In some examples, the thickness of encapsulant 470 can range from approximately 10 μm to approximately 1200 μm. In some examples, interconnect structure 140 can be in encapsulant 470.

Figure 6G:
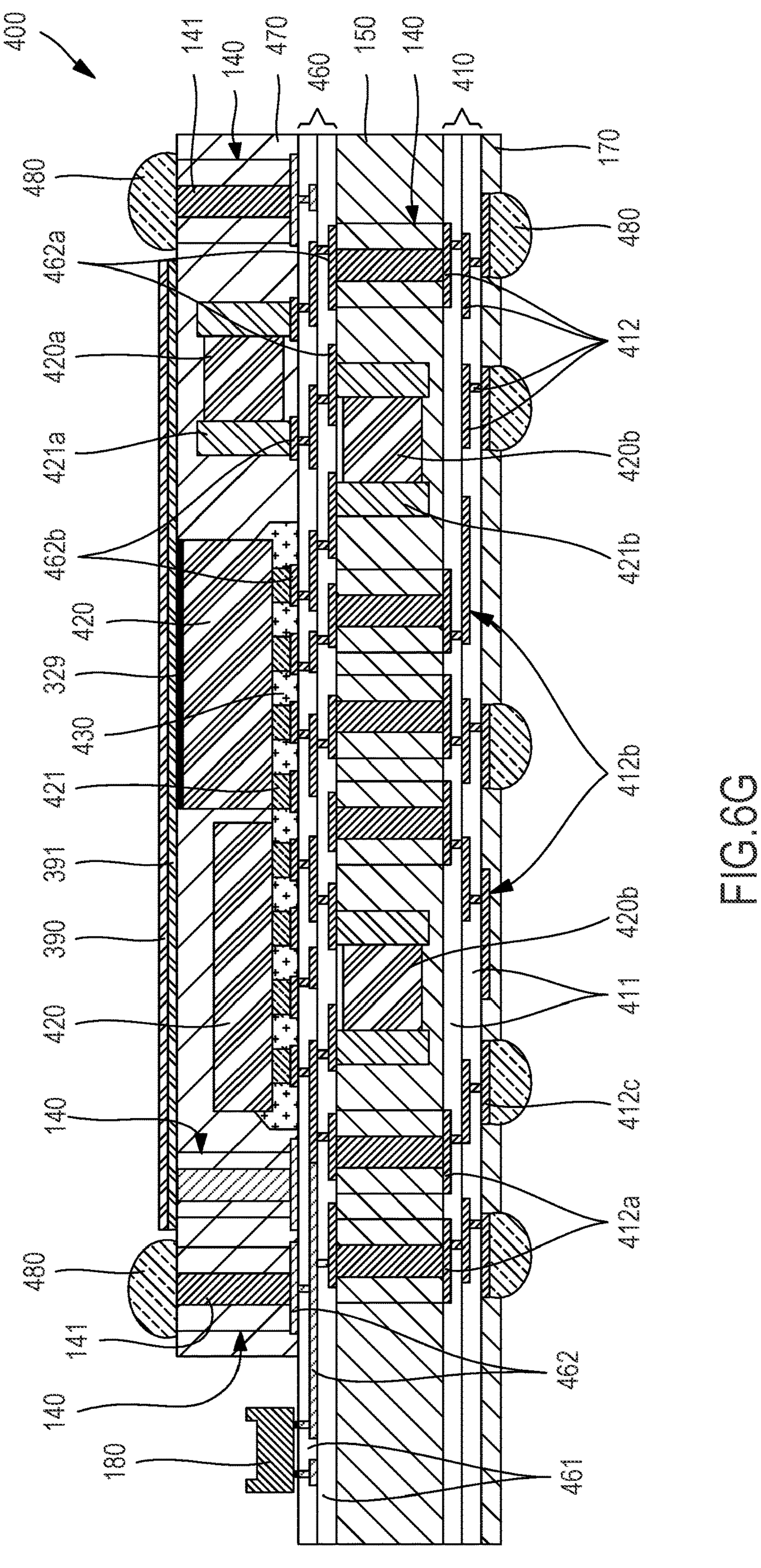

FIG. 6G shows electronic device 400 at a later stage of manufacture. In the example shown in FIG. 6G, external interconnects 480 can be provided. In some examples, external interconnects 480 can be coupled with metal interconnect 141 of interconnect structures 140 adjacent encapsulant 470. In some examples, external interconnects 480 can be coupled with external terminals 412*c* of substrate 410. In some examples, external interconnects 480 can be coupled with electronic component 420, electronic component 420*a*, or electronic component 420*b* through substrate 410, interconnect structure 140, and substrate 460. In some examples, external interconnects 480 can comprise tin (Sn), silver (Ag), lead (Pb), copper (Cu), Sn—Pb, Sn37-Pb, Sn95-Pb, Sn—Pb—Ag, Sn—Cu, Sn—Ag, Sn—Au, Sn—Bi, or Sn—Ag—Cu. For example, external interconnects 480 can be formed through a reflow process after forming a conductive material including solder on outward terminals 412*c* or on interconnect structures 140 through a ball-drop method. External interconnects 480 can comprise or be referred to as conductive balls such as solder balls, conductive pillars such as copper pillars, or conductive posts having solder caps provided on copper pillars. In some examples, external interconnects 480 can be ball-grid arrayed or land-grid arrayed outside substrate 410. In some examples, the size of external interconnect 480 can range from approximately 25 μm to approximately 300 μm. In some examples, external interconnects 480 can be referred to as external input/output terminals of electronic device 400. Note that in some examples, some or all of external interconnects 480 can be omitted at either side or at both sides of electronic device 400. In some examples, a singulation process for separating into individual electronic elements 400 by sawing substrate 410 and substrate 460 and encapsulant 150 and encapsulant 470 can be performed.

The present disclosure includes reference to certain examples. It will be understood by those skilled in the art, however, that various changes may be made, and equivalents may be substituted without departing from the scope of the disclosure. In addition, modifications may be made to the disclosed examples without departing from the scope of the present disclosure. Therefore, it is intended that the present disclosure is not limited to the examples disclosed, but that the disclosure will include all examples falling within the scope of the appended claims.

The invention claimed is:

1. An electronic device, comprising:

a first substrate comprising a first dielectric structure and a first conductive structure;

a first interconnect structure over an inward side of the first substrate and coupled with the first conductive structure;

a first encapsulant over the inward side of the first substrate and contacting a lateral side of the first interconnect structure;

a second substrate over the first encapsulant and comprising a second dielectric structure and a second conductive structure, wherein the second conductive structure is coupled with the first interconnect structure; and a first electronic component coupled with an outward side of the first substrate;

wherein the first electronic component is coupled with the second conductive structure via the first interconnect structure and the first conductive structure; and wherein the first interconnect structure comprises:

an interconnect encapsulant; and a metal interconnect bounded by the interconnect encapsulant.

2. The electronic device of claim 1, comprising:

a second encapsulant over an outward side of the second substrate and covering the second conductive structure;

wherein the second encapsulant comprises a first material and the second dielectric structure comprises a second material different than the first material.

3. The electronic device of claim 1, wherein:

the second conductive structure comprises an antenna pattern.

4. The electronic device of claim 1, comprising:

a second encapsulant coupled with the outward side of the first substrate and contacting a lateral side of the first electronic component.

5. The electronic device of claim 4, comprising:

a lid coupled with an outward side of the second encapsulant.

6. The electronic device of claim 5, comprising:

a thermal interface material between the first electronic component and the lid; wherein:

the first electronic component comprises a metal layer on a backside of the first electronic component; and the metal layer is coupled with the thermal interface material.

7. The electronic device of claim 1, wherein:

the first substrate comprises a first redistribution layer (RDL) substrate; and the second substrate comprises a second RDL substrate.

8. An electronic device, comprising:

a first substrate comprising a first dielectric structure and a first conductive structure;

a first interconnect structure over a top side the first substrate and coupled with the first conductive structure;

a first encapsulant over the first substrate and contacting a lateral side of the first interconnect structure;

a second substrate over the first encapsulant and comprising a second dielectric structure and a second conductive structure, wherein the second conductive structure is coupled with the first interconnect structure;

a first electronic component over a top side of the second substrate and coupled with the second conductive structure;

a second electronic component coupled with the second conductive structure; and a second encapsulant over the top side of the second substrate and contacting a lateral side of the first electronic component;

wherein the first interconnect structure comprises:

an interconnect encapsulant; and a metal interconnect bounded by the interconnect encapsulant.

9. The electronic device of claim 8, wherein:

the second electronic component comprises a decoupling capacitor.

10. The electronic device of claim 8, wherein:

the second electronic component is coupled with a bottom side of the second substrate; and the second electronic component is in the first encapsulant and at least partially within a footprint of the first electronic component.

11. The electronic device of claim 8, wherein:

the second electronic component is coupled with the top side of the second substrate; and the second electronic component is in the second encapsulant.

12. The electronic device of claim 8, comprising:

a third electronic component coupled with the second conductive structure;

wherein the second electronic component and third electronic component are on opposite sides of the second substrate.

13. The electronic device of claim 8, wherein:

the first substrate comprises a first redistribution layer (RDL) substrate; and the second substrate comprises a second RDL substrate.

14. A method to manufacture an electronic device, comprising:

providing a first interconnect structure;

providing a first encapsulant contacting a lateral side of the first interconnect structure;

providing a first substrate coupled with a first side of the first encapsulant, wherein the first substrate comprises a first dielectric structure and a first conductive structure, and wherein the first conductive structure is coupled with the first interconnect structure;

providing a second substrate coupled with a second side of the first encapsulant, wherein the second substrate comprises a second dielectric structure and a second conductive structure, and wherein the second conductive structure is coupled with the first interconnect structure; and providing a first electronic component coupled with the first substrate;

wherein the first electronic component is coupled with the second conductive structure via the first interconnect structure and the first conductive structure; and wherein the first interconnect structure comprises:

an interconnect encapsulant; and a metal interconnect bounded by the interconnect encapsulant.

15. The method of claim 14, comprising:

providing a second encapsulant coupled with the second substrate and covering the second conductive structure.

16. The method of claim 14, wherein:

the second conductive structure comprises an antenna pattern.

17. The method of claim 14, comprising:

providing a second encapsulant coupled with the first substrate and contacting a lateral side of the first electronic component.

* * * * *